United States Patent
Dupuis et al.

(10) Patent No.: US 7,679,162 B2
(45) Date of Patent: Mar. 16, 2010

(54) INTEGRATED CURRENT SENSOR PACKAGE

(75) Inventors: Timothy J. Dupuis, Austin, TX (US); John Pavelka, Austin, TX (US)

(73) Assignee: Silicon Laboratories Inc., Austin, TX (US)

( * ) Notice: Subject to any disclaimer, the term of this patent is extended or adjusted under 35 U.S.C. 154(b) by 545 days.

(21) Appl. No.: 11/311,517

(22) Filed: Dec. 19, 2005

(65) Prior Publication Data

US 2007/0139066 A1  Jun. 21, 2007

(51) Int. Cl.
H01L 29/00 (2006.01)
H01L 23/02 (2006.01)
H01L 23/34 (2006.01)

(52) U.S. Cl. ............... 257/531; 257/678; 257/724; 257/726; 257/904; 257/924; 257/E21.022

(58) Field of Classification Search ......... 257/531, 257/678, 726, E21.022, 724, 904, 924
See application file for complete search history.

(56) References Cited

U.S. PATENT DOCUMENTS

| | | | |
|---|---|---|---|
| 4,176,374 A | 11/1979 | Eames | |
| 4,240,059 A | 12/1980 | Wolf et al. | |
| 4,536,706 A | 8/1985 | Kemper | |
| 4,691,338 A | 9/1987 | Makino | |
| 4,926,116 A | 5/1990 | Talisa | |
| 4,931,725 A | 6/1990 | Hutt et al. | |
| 4,939,541 A | 7/1990 | Sugiura | |
| 5,015,945 A | 5/1991 | Radun | |
| 5,032,785 A | 7/1991 | Mathis et al. | |
| 5,070,317 A | 12/1991 | Bhagat | |
| 5,124,648 A | 6/1992 | Webb et al. | |
| 5,128,611 A | 7/1992 | Konrad | |
| 5,478,773 A * | 12/1995 | Dow et al. | 438/381 |
| 5,696,441 A | 12/1997 | Mak et al. | |
| 5,717,327 A | 2/1998 | Bradford | |
| 5,815,391 A | 9/1998 | Pelly | |
| 5,952,704 A * | 9/1999 | Yu et al. | 257/531 |
| 5,963,038 A | 10/1999 | De Jong et al. | |
| 5,986,341 A * | 11/1999 | Usami et al. | 257/723 |
| 6,054,329 A * | 4/2000 | Burghartz et al. | 438/3 |
| 6,061,224 A | 5/2000 | Allen | |
| 6,069,397 A * | 5/2000 | Cornett et al. | 257/531 |

(Continued)

FOREIGN PATENT DOCUMENTS

EP    0893696 A    1/1999

(Continued)

OTHER PUBLICATIONS

Final Office Action dated May 31, 2007 in U.S. Appl. No. 11/311,603, filed Dec. 19, 2005, naming inventors Timothy J. Dupuis, et al.

(Continued)

*Primary Examiner*—Ida M Soward
(74) *Attorney, Agent, or Firm*—Zagorin O'Brien Graham LLP

(57) ABSTRACT

An integrated current sensor package includes an integrated circuit having a coil in a metal layer of the circuit. A wire is placed close enough to the coil such that the coil and the wire are inductively coupled with each other.

17 Claims, 7 Drawing Sheets

U.S. PATENT DOCUMENTS

| | | | |
|---|---|---|---|
| 6,097,203 | A | 8/2000 | Parker et al. |
| 6,271,655 | B1 | 8/2001 | Weber et al. |
| 6,274,920 | B1* | 8/2001 | Park et al. .................. 257/531 |
| 6,291,872 | B1* | 9/2001 | Wang et al. ................. 257/531 |
| 6,356,068 | B1 | 3/2002 | Steiner et al. |
| 6,384,478 | B1* | 5/2002 | Pour .......................... 257/724 |
| 6,414,475 | B1 | 7/2002 | Dames et al. |
| 6,577,115 | B1 | 6/2003 | Carpenter |
| 6,608,361 | B2* | 8/2003 | Chang et al. ................ 257/499 |
| 6,661,231 | B1 | 12/2003 | Arai et al. |
| 6,781,359 | B2 | 8/2004 | Stauth et al. |
| 6,791,341 | B2 | 9/2004 | Shenai et al. |
| 6,828,770 | B1 | 12/2004 | McCauley et al. |
| 6,835,576 | B2* | 12/2004 | Matsuzaki et al. ............. 438/3 |
| 6,964,918 | B1* | 11/2005 | Fan et al. .................... 438/614 |
| 6,972,658 | B1* | 12/2005 | Findley et al. .............. 336/200 |
| 6,987,307 | B2* | 1/2006 | White et al. ................. 257/508 |
| 7,118,925 | B2* | 10/2006 | Brennan et al. ................ 438/3 |
| 7,196,397 | B2* | 3/2007 | Chiola et al. ................ 257/531 |
| 7,203,047 | B2 | 4/2007 | Holce et al. |
| 7,227,240 | B2* | 6/2007 | Knapp et al. ................ 257/531 |
| 7,239,123 | B2 | 7/2007 | Rannow et al. |
| 7,268,409 | B2* | 9/2007 | Tseng et al. ................. 257/531 |
| 7,292,400 | B2 | 11/2007 | Bishop |
| 7,400,025 | B2* | 7/2008 | Pitts et al. ................... 257/531 |
| 7,453,142 | B2* | 11/2008 | Lee et al. .................... 257/691 |
| 2002/0039667 | A1* | 4/2002 | Takaya et al. ............... 428/692 |
| 2002/0090755 | A1* | 7/2002 | Matsuzaki et al. .......... 438/108 |
| 2002/0105080 | A1* | 8/2002 | Speakman .................. 257/749 |
| 2003/0098505 | A1* | 5/2003 | Kimura et al. .............. 257/724 |
| 2004/0021218 | A1* | 2/2004 | Hayama et al. ............. 257/700 |
| 2004/0263148 | A1 | 12/2004 | Takabatake |
| 2005/0003562 | A1* | 1/2005 | Bhatt et al. .................... 438/3 |
| 2005/0007296 | A1* | 1/2005 | Endo et al. ................... 343/895 |
| 2005/0103112 | A1* | 5/2005 | Pedersen et al. .............. 73/718 |
| 2005/0134254 | A1 | 6/2005 | Roden et al. |
| 2005/0156587 | A1 | 7/2005 | Yakymyshyn et al. |
| 2005/0253055 | A1* | 11/2005 | Sprague et al. ............. 250/234 |
| 2005/0285262 | A1* | 12/2005 | Knapp et al. ................ 257/723 |
| 2006/0020371 | A1* | 1/2006 | Ham et al. .................. 700/266 |
| 2006/0038552 | A1* | 2/2006 | Omura et al. ............ 324/117 R |
| 2006/0044088 | A1* | 3/2006 | Vaitkus et al. ................. 335/78 |
| 2006/0061350 | A1* | 3/2006 | Myers et al. ............ 324/117 R |
| 2006/0152323 | A1* | 7/2006 | Pavier ........................ 336/200 |
| 2006/0181385 | A1* | 8/2006 | Hurley ....................... 336/200 |
| 2006/0267724 | A1* | 11/2006 | Parsons ...................... 338/25 |
| 2007/0018298 | A1* | 1/2007 | Gamand ..................... 257/686 |
| 2007/0072340 | A1* | 3/2007 | Sanzo et al. ................ 438/106 |
| 2007/0114651 | A1* | 5/2007 | Marimuthu et al. ......... 257/690 |
| 2008/0157272 | A1* | 7/2008 | Tanaka ....................... 257/531 |

FOREIGN PATENT DOCUMENTS

| | | |
|---|---|---|
| EP | 1498916 A | 1/2005 |
| WO | WO02/082109 | 10/2002 |

OTHER PUBLICATIONS

"1- and 2-Axis Magnetic Sensors HMC1001/1002, HMC1021/1022," Honeywell Sensor Products Data Sheet, Rev. B, Apr. 2000, 15 pages.

ACS704 Data Sheet, Allegro MicroSystems, Inc., (date prior to Oct. 9, 2005 email listing reference) 2 pages.

ACS704ELC-015 Data Sheet, Allegro MicroSystems, Inc. Rev. 6, 2005, 19 pages.

"Battery Powered Current Sensor" *Ask the Engineer*, Honeywell Solid State Electronics Center, 2003, 1 page.

Friedrich, Andreas P., and Lemme, Helmuth, "The Universal Current Sensor," *Sensors* magazine, May 1, 2000, 12 pages.

Jalebi, Ehsan Abdi et al., Real Time Rotor Bar Current Measurements Using a Rogowski Coil Transmitted Using Wireless Technology, University of Cambridge White Paper, Aug. 9, 2003, 9 pages.

Jingsheng, Liao et al., "Studies of Rogowski Coil Current Transducer for Low Amplitude Current (100A) Measurement," *IEEE CCECE 2003 Canadian Conference on Electrical and Computer Engineering*, vol. 1, May 4-7, 2003, 5 pages.

Koon, William, "Current Sensing for Energy Metering," in *Conference Proceedings IIC-China/ESC-China 2002*, pp. 321-324, 2002.

"Magnetic Current Sensing," AN-209, Honeywell Solid State Electronics Center, Apr. 2000, 7 pages.

Ward, D. A. and Exon, J. La T., "Using Rogowski Coils for Transient Current Measurements," *Engineering Science and Education Journal*, Jun. 1993, 9 pages.

U.S. Appl. No. 11/311,603, filed Dec. 19, 2005, entitled, "Integrated Current Sensor," naming inventors Timothy J. Dupuis and John Pavelka.

U.S. Appl. No. 11/428,082, filed Jun. 30, 2006, entitled, "Current Sensor with Reset Circuit," naming inventors Donald E. Alfano and Timothy J. Dupuis.

Toru Nakura, Makoto Ikeda, and Kunihiro Asada University of Tokyo, Tokyo, Japan, "On-chip di/dt Detector IP for Power Supply", D and R Headline News, www.design-reuse.com, pp. 1-9.

International Search Report, mailed Nov. 2, 2007, for International Application No. PCT/US2006/048325, 4 pages.

Non-Final Office Action, mailed Dec. 15, 2006, for U.S. Appl. No. 11/311,603, 14 pages.

Notice of Allowance, mailed Jan. 16, 2008 for U.S. Appl. No. 11/311,603, 10 pages.

Non-Final Office Action, mailed Jun. 25. 2009. in U.S. Appl. No. 12/167,692, 20 pages.

* cited by examiner

INTEGRATED CURRENT SENSOR PACKAGE

TECHNICAL FIELD OF THE INVENTION

The present invention relates to current sensors, and more particularly, to an improved current sensor having low loss, small size, low cost and high accuracy.

BACKGROUND OF THE INVENTION

Within various circuit implementations, such as power supplies, there is often the need to detect a current provided at a particular point within a circuit to use as feedback for controlling other parts of the circuit. Various solutions are presently used to sense currents within electronic circuits but each of these suffer from various shortcomings. A first approach, illustrated in FIG. 1, utilizes a resistor 102 connected across the inputs of an operational amplifier 104 to provide a voltage $V_{SENSE}$ that may be used to determine a current 106. A low value resistor 102 may be used in the range of 10 milliohms. The problem with this approach is the high loss provided by the circuit. This may be overcome by reducing the resistor 102 to reduce the loss, however, this also reduces the signal $V_{SENSE}$ that may be detected. The resistor 102 is not integrated and this type of circuit may be used to sense current within direct current (DC) applications.

Referring now to FIG. 2, there is illustrated a further prior art system utilizing a hall effect device 202 connected across the inputs of an operational amplifier 204. The hall effect device 202 generates a voltage across the inputs of the operational amplifier 204 responsive to the current 206 to provide the output signal $V_{SENSE}$. While this approach has a low loss, the use of the hall effect device 202 causes the circuit to have a higher cost, and the accuracy and noise issues are greater within the hall device as the hall voltage is a small value. This circuit may also be used to detect current in a direct current (DC) system.

Referring now to FIG. 3, there is illustrated the use of a magneto resistive sensor. The magneto resistive sensor consists of a magneto resistive element 302 connected across the inputs of operational amplifier 304 to detect the current 306. The magneto resistive element 302 has the property that the resistance of the element changes with respect to the magnetic field caused by the current 306. This circuit requires the use of special technology which raises the cost of the device. Additionally, accuracy issues arise even though the current may be sensed with very low loss.

Referring now to FIG. 4, an alternative prior art method for detecting current is through the use of a current transformer 402 is illustrated. The current transformer has a primary side 404 with a single loop and a secondary side 406 with multiple loops. A load resistance 408 is in parallel with the secondary side 406 of the transformer 402. The current transformer 402 is used to detect the current 410. The transformer 402 creates an output current equal to Ip/n with Ip being the detected current and n being the turns ratio of the transformer 402. The resistance of the transformer is reflected to the primary side with the ratio $1/n^2$. A current transformer will only work within alternating current (AC) circuits. While current transformers work well for detecting currents, they are large and have a medium loss level associated therewith. Thus, some method for detecting a current within a power electronic circuit that overcome the shortcomings of these prior art methods would be greatly desirable.

Another method for measuring currents involves the use of a Rogowski coil. The voltage induced in a Rogowski coil is very small and easily disturbed when measured current is less than, for example, 100 Amps. A Rogowski current transducer has a number of advantages over the current transformer illustrated in FIG. 4. For example, it is linear, has no core saturation effects and has wide band width, wide measurement range and a simple structure. This Rogowski coil comprises a toroidal winding placed around a conductor being measured. It consists of a wire wound on a non-magnetic core. The coil is effectively a mutual inductor coupled to the inductor being measured where the output from the winding is an EMF proportional to the rate of change of current.

SUMMARY OF THE INVENTION

The present invention disclosed and claimed herein, in one aspect thereof, comprises an integrated current sensor package. The integrated current sensor package includes an integrated circuit including a coil in a metal layer of the integrated circuit. A wire is associated with the integrated circuit and placed close enough to the coil such that the coil and the wire are inductively coupled with each other.

BRIEF DESCRIPTION OF THE DRAWINGS

For a more complete understanding of the present invention and the advantages thereof, reference is now made to the following description taken in conjunction with the accompanying Drawings in which.

DETAILED DESCRIPTION OF THE INVENTION

Figure 5A:
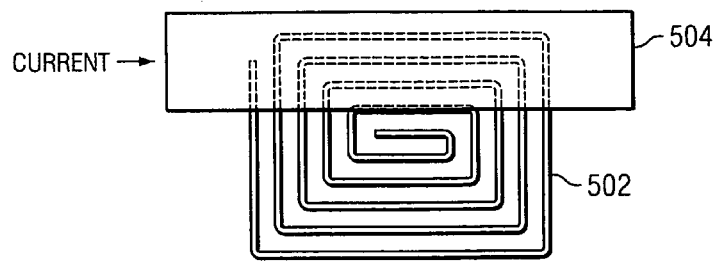
FIG. 5a illustrates a coil in close proximity with a large current carrying wire according to the present disclosure.

Referring now to the drawings, and more particularly to FIG. 5a, there is illustrated a coil 502 in close proximity with a large current carrying wire 504 such that the coil 502 and current carrying wire 504 act as coupled inductors. The coupled inductors, along with on-chip electronics which will be discussed herein below, allow the creation of the $V_{SENSE}$ signal which is proportional to the input current $I_p$ in a manner that has very low loss, is very small and is a low cost implementation. This provides a better solution than all of the implementations described with respect to FIGS. 1-4. The current provided through the current carrying wire may be up to 10 amps. The coil 502 is placed very near the current carrying wire 504 in order to create the inductive coupling between the wire 504 and coil 502. The wire 504 only overlaps only one side of the coil 502 such that the winding are all going the same way and the magnetic flux will add together. This causes an induced current in the other side of the coil 502 that is not overlapped by the wire 504.

Figure 5B:
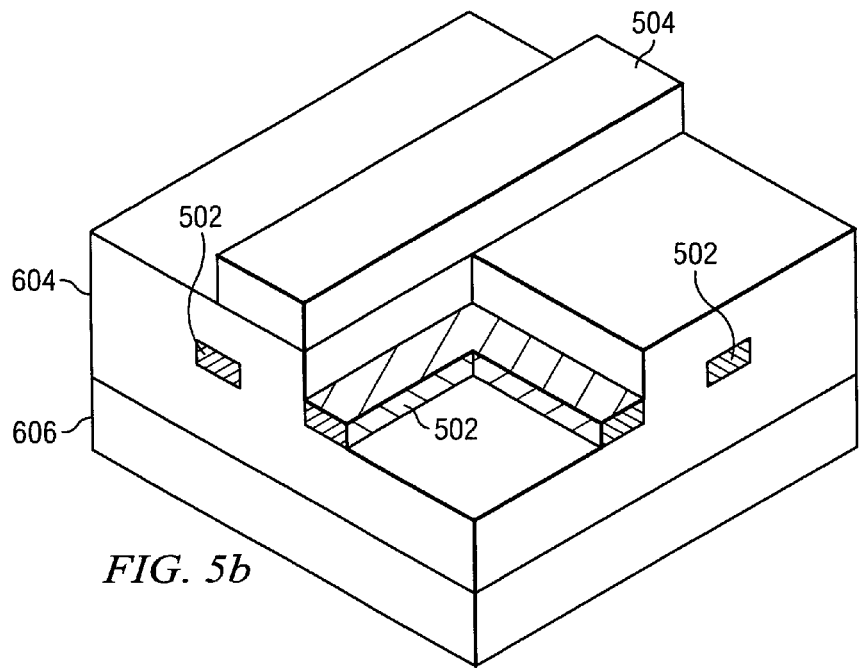
FIG. 5b illustrates a perspective cut away view of the integrated circuit, including a coupled coil and wire.

Referring now to FIG. 5b, there is illustrated a perspective cut away view of the coil 502 and wire 504 illustrated in FIG. 5a. In this configuration one of the coupled inductors is placed within a silicon dioxide layer 604 on top of a die 606 of an integrated circuit chip. The coil 502 consists of metal runs within the M5 layer of the silicon dioxide layer 604. The wire 504 would rest on the silicon dioxide layer 604 in close enough proximity to the coil 502 such that the current passing through wire 504 would induce another current within the portion of the coil 502 over which the wire 504 was not located.

Figure 1:
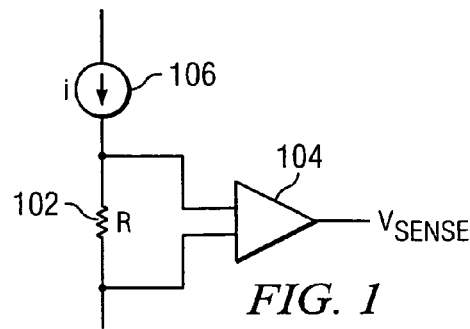
FIG. 1 illustrates a prior art current sensor.
Figure 2:
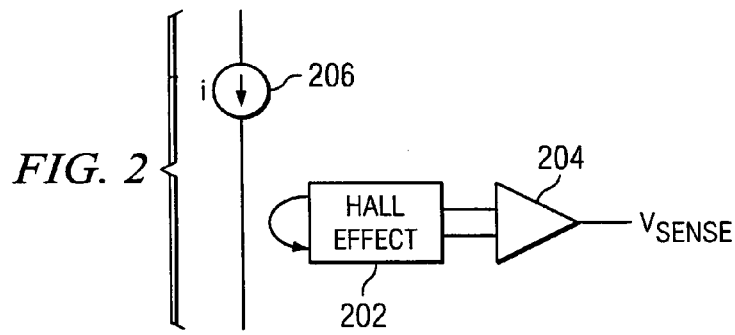
FIG. 2 illustrates a further prior art current sensor.
Figure 3:
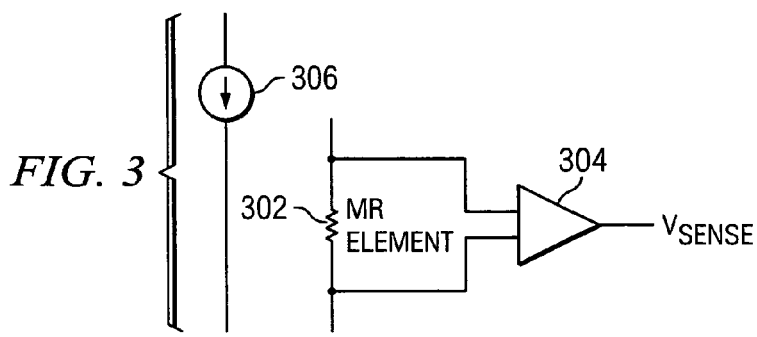
FIG. 3 illustrates yet another prior art current sensor.
Figure 4:
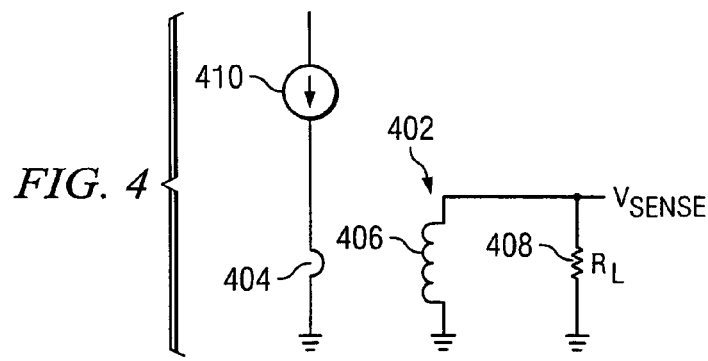
FIG. 4 illustrates a further prior art current sensor.
Figure 6:
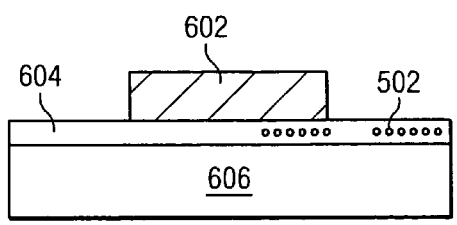
FIG. 6 is a cross-sectional view of a first embodiment an integrated current sensor package.

There are multiple ways for implementing the coupled inductor configuration illustrated in FIG. 1 within a chip package. The first of these comprises an on-chip solution with bumping copper as illustrated in FIG. 6. Flip chip bump houses can deposit a copper wire 602 on top of a silicon dioxide layer 604 of a die 606. The copper wire 602 may comprise 15 μm of copper. The coil 502 is embedded within the M5 layer of the silicon dioxide layer 604.

Figure 7:
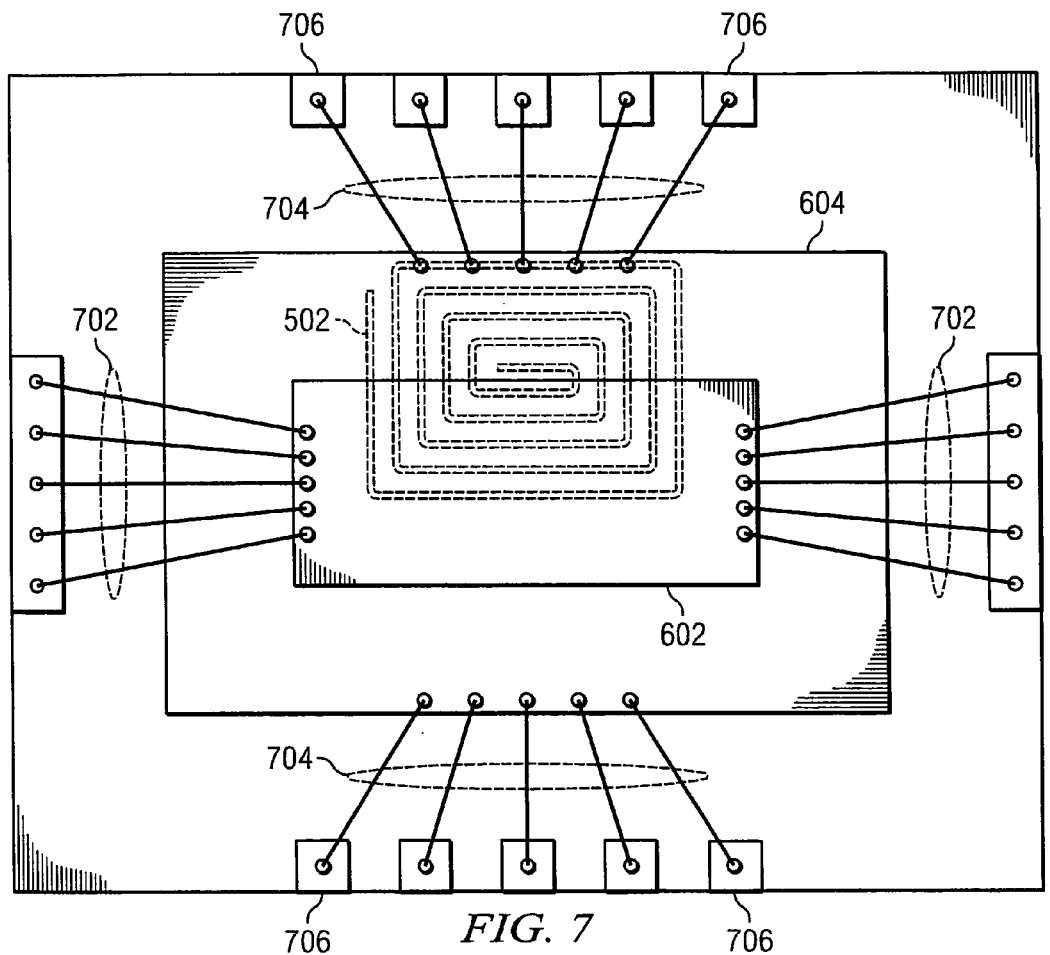
FIG. 7 is a top view of the first embodiment of the integrated current sensor package.

Referring now to FIG. 7, there is illustrated a top view of the package configuration. The copper wire 602 is placed upon the silicon dioxide layer 604 of the die 606 (not shown). The coil 502 is placed within the M5 layer of the silicon dioxide 604 parallel to the wire 502. Bond wires 702 connect the copper wire 502 on the die 606 with external outputs. The bond wires 702 support a maximum current of 1-2 amps, thus many bond wires are required to be connected to the copper wire 602 for higher currents. Additional bond wires 704 connect the silicon dioxide layer 604 of the die 606 to external output pins 706 of the chip. Using the above-described package configuration, a 10 amp sensor may be constructed.

Figure 8:
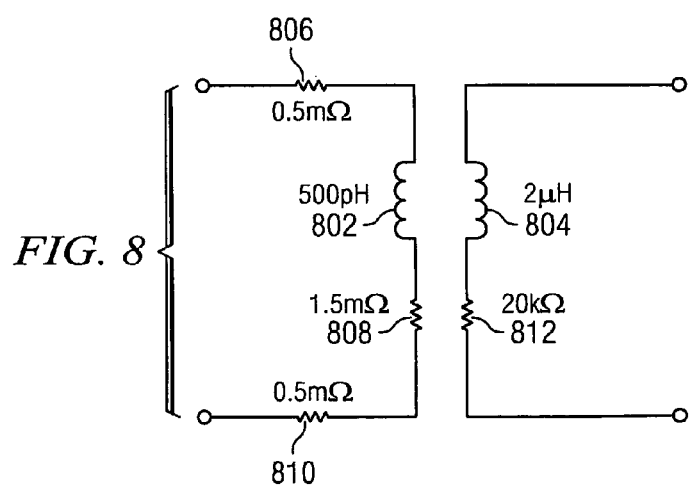
FIG. 8 is a simulation of the integrated current sensor illustrated in FIGS. 6 and 7.

Referring now to FIG. 8, there is provided a simulation of the inductive coil package illustrated in FIGS. 6 and 7. The coil 802 on the primary side comprises a 500 pH coil. The coil 804 on the secondary side comprises a 2 μH coil. Connected to a first side of the 500 pH coil 802 is a 1.5 milli-ohm resistor in series with a 0.5 milli-ohm resistor 810 which comprises the parasitic capacitance of the coil 802. Connected to one output side of the 2 μH coil 804 is a 20 kiliohm resistor 812 which comprises the parasitic capacitance of the coil 804. The 0.5 milli-ohm transistor 810 comprises the resistance provided by the bond wires and package. Since the copper wire 602 is not too thick and lies very close to the coil 502 of the chip, coupling coefficients between the copper wire 602 and the coil 502 are very good, assuming there is a distance of approximately two micrometers from the M5 layer to the copper wire 602.

Figure 9:
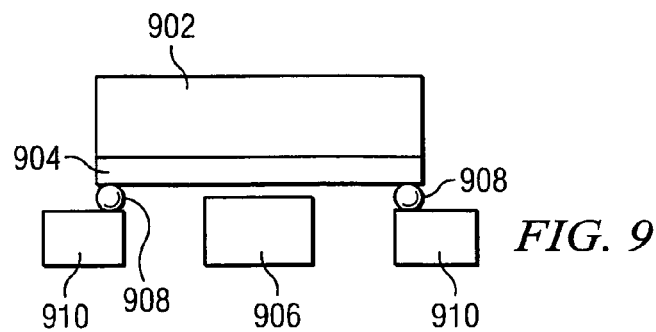
FIG. 9 is a cross-sectional view of an alternative embodiment of the integrated current sensor package.

Referring now to FIG. 9, there is illustrated an alternative configuration wherein a package lead frame and flip chip configuration are used. A custom package lead frame may be designed as follows. The die 902 is placed upside down with the silicon dioxide layer 904 suspended a short distance above a large copper slug 906. The copper slug 906 may have a large cross sectional area for low loss. In this embodiment the slug 906 has a 200×200 μm cross section. The die 902 is suspended above the copper slug 906 on solder balls 908. The solder balls 908 rest on top of a lead frame 910. When heat is applied to the circuit, the solder bumps 908 reflow causing the silicon dioxide layer 904 to rest directly upon the copper slug 906. In this design, the die chip 902 would be bumped and then flipped.

Figure 10:
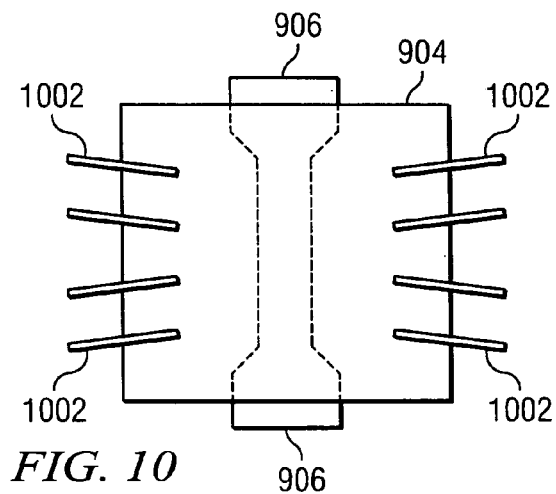
FIG. 10 is a top view of the alternative embodiment of the integrated current sensor package of FIG. 9.

Referring now to FIG. 10, there is illustrated a top view with the silicon dioxide layer 904 resting on top of the copper slug 906. Bond wires 1002 may then be connected to the silicon dioxide layer 904. This design has a very low resistance.

Figure 11:
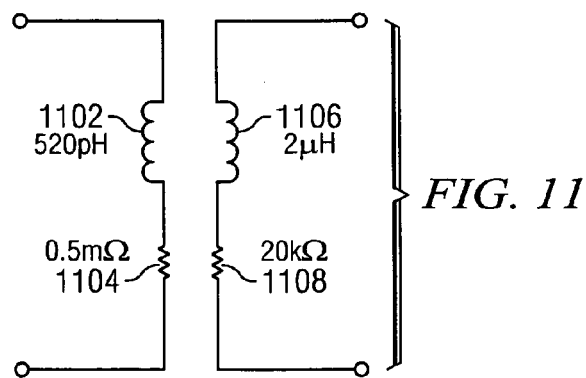
FIG. 11 is a simulation of the alternative embodiment of the integrated current sensor package illustrated in FIGS. 9 and 10.

Referring now to FIG. 11, there is illustrated the simulation of the embodiment illustrated in FIGS. 9 and 10. In this simulation wherein a 200×200 μm copper slug 906 is utilized that is 3 μm away from the coil 502, the primary side consists of a 520 pH coil 1102 in series with a 0.5 milli-ohm resistor 1104. The secondary side consists of 2 μH coil 1106 in series with a 20 kili-ohm resistor 1108. The coupling coefficient is reduced due to the lower current density in the slug.

Figure 16:
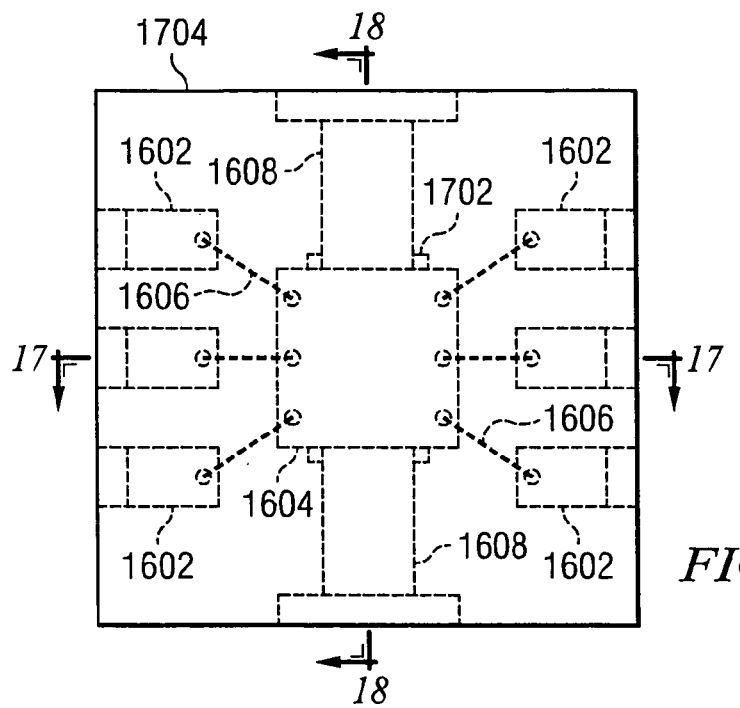
FIG. 16 is a top view of the further embodiment of the integrated current sensor package.

Referring now to FIG. 16 there is illustrated a bottom view of a further configuration wherein a lead on chip configuration is used. The lead frame 1602 is connected to the die 1604 by bond wires 1606. The wire 1608 in connected to the die 1604 by tape. The wire 1608, a current carrying conductor, is coupled to a coil in the die 1604.

Figure 17:
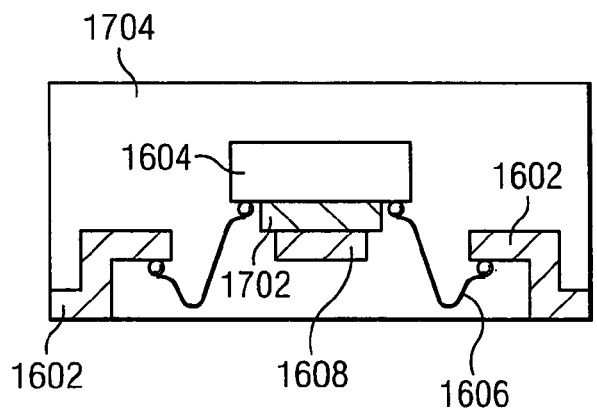
FIG. 17 is a cross-sectional view of the embodiment of the integrated current sensor package in FIG. 16.
Figure 18:
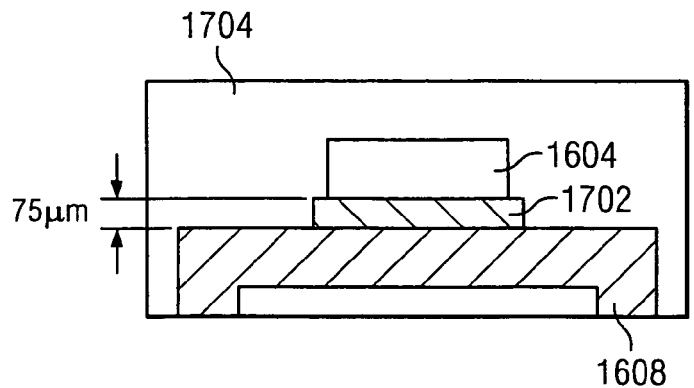
FIG. 18 is a further cross-sectional view of the embodiment of the integrated current sensor package in FIG. 16.

Referring now to FIG. 17, there is illustrated a cross sectional view of FIG. 16 along line B-B. The die 1604 is connected to the wire 1608 via the tape 1702 as described previously. The lead frame 1602 connects to the die 1604 via bond wires 1606. The tape 1702 is approximately 75 μm thick. The entire structure is contained within a mold compound 1704. Referring now to FIG. 18, there is illustrated a cross sectional view of FIG. 16 along line A-A.

Figure 12:
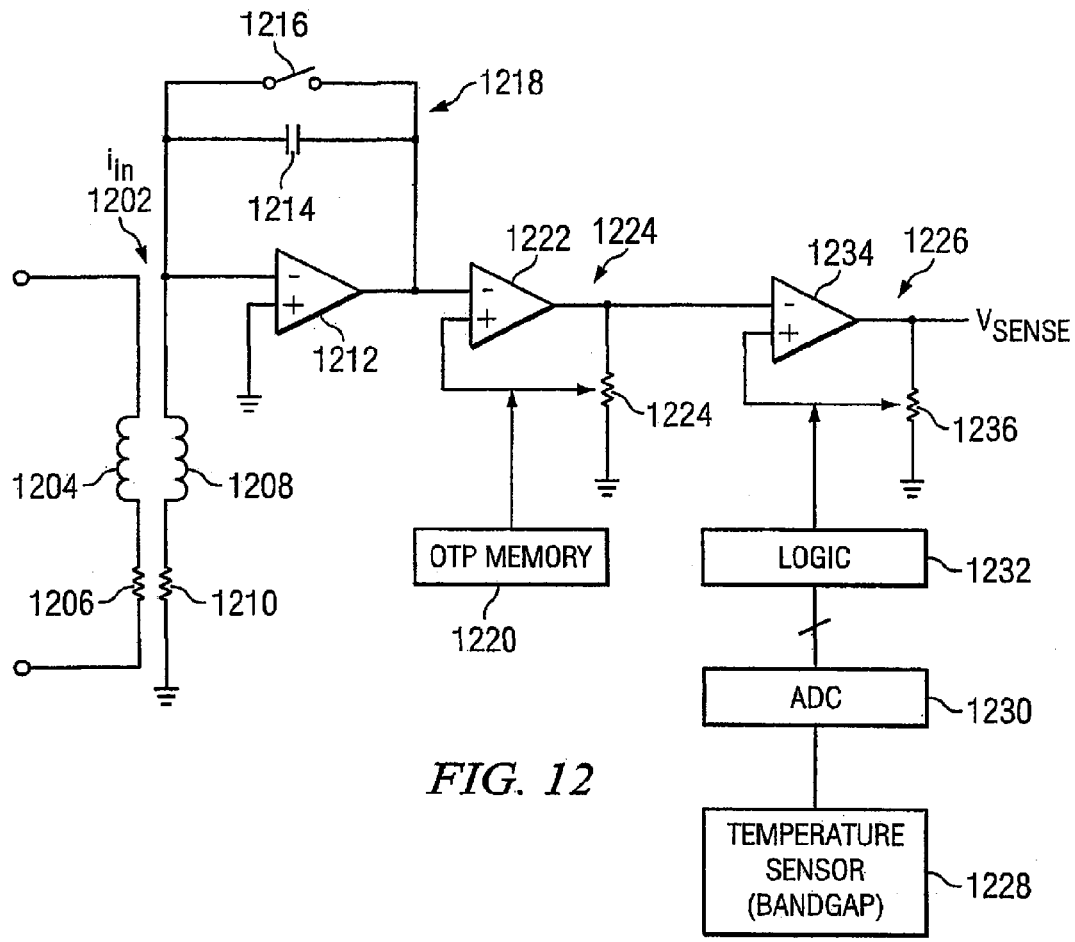
FIG. 12 is a schematic diagram of the integrated current sensor.

Referring now to FIG. 12, there is illustrated a schematic diagram of the electronic circuit necessary for recreating the $V_{SENSE}$ signal when detecting the current $I_p$ using the coupled indicator as illustrated in FIG. 5. The coupled inductor 1202 comprises either of the configuration packages described hereinabove or, alternatively, may comprise a different undescribed configuration package that places the coil in close proximity with the wire to inductively couple them together. The primary side is modeled by inductor 1204 in series with resistor 1206. The secondary side is modeled by inductor 1208 which is connected to a resistor 1210. The resistor 1210 is then connected to ground. The other side of inductor 1208 outputs the induced current $I_n$ which is connected to the negative input of an operational amplifier 1212. The positive input of operational amplifier 1212 is connected to ground.

The current through the secondary is dominated by the resistive loss of resistor 1210 and is the derivative of the primary current. An integrator circuit 1218 is used to integrate the induced current $I_n$. The integrator circuit 1218 consists of the operational amplifier 1212, a capacitor 1214 connected between the output of operational amplifier 1212 and the negative input of operational amplifier 1212 and a reset switch 1216 connected between the output of operational amplifier 1212 and the negative input of operational amplifier 1212 in parallel with capacitor 1214. Thus, the current $I_n$ may be determined according to the equation:

$$I_n = \frac{L_m}{R_1}\frac{dip}{dt}$$

By integrating on the capacitor 1214 an output voltage $V_{SENSE}$ is attained according to the following equation:

$$V_{SENSE} = \frac{1}{C}\int I_n dt = \frac{L_m}{R_1 C} \cdot ip$$

In this case, $L_m$, the mutual inductance is well controlled, but can vary from part to part due to assembly variations. The capacitance C will vary from part to part and probably can be controlled to +/−5% accuracy. The capacitor 1214 will not have any appreciable temperature coefficient. $R_1$ is dominated by the metal resistance of the coil and will vary from part to part. It is equal to the value of the resistor 1210 and also has a large temperature coefficient.

In order to obtain overall accuracy for the capacitance C which varies from part to part, a factory calibration using a one time programmable (OTP) memory 1220 can be used. In a preferred embodiment, a low cost 32 bit OTP memory may be utilized. The OTP memory 1220 provides a control variable to a programmable gain amplifier 1222. The first gain stage 1223, consisting of programmable amplifier 1222, programmable resistance 1224 and the OTP memory 1220, compensates for part to part variations of the circuit. The OTP memory 1220 is programmed at the factory based upon measurements made there. The programmable gain amplifier 1222 has its negative input connected to the output of the operational amplifier 1212. A programmable resistance 1224 is connected between the output of the programmable amplifier 1222 and ground. The positive input of programmable amplifier 1222 is connected to the programmable resistance 1224. The value of the programmable resistance 1224, and thus the gain of the first gain stage 1223, is controlled by the values provided from the OTP memory 1220.

A second gain stage 1226 compensates for differences in the resistance caused by temperature variations in the device. A temperature sensor 1228 and A-D converter 1230 are used to generate a digital temperature value to compensate for the coil resistance temperature coefficient. The temperature sensor 1228 detects the temperature and generates an analog representation of the temperature. The ADC 1230 converts the analog signal into a digital signal. The digital temperature value is provided via a control bus 1231 to control logic 1232. In one embodiment the control logic 1231 may consist of a look-up table. The control table would include various control values associated with particular temperature values. Alternative embodiments may include a microprocessor programmed to control the output according to various temperature levels or other types of digital logic. The control logic 1232 provides a control value to the programmable gain amplifier 1234 and programmable resistance 1236. The negative input of programmable amplifier 1234 is connected to the output of programmable amplifier 1222. The programmable resistor 1236 is connected between the output of programmable amplifier 1234 and ground. The positive input of programmable amplifier 1234 is connected to the programmable resistance 1236. The particular value of the programmable resistance 1236, and thus the gain of the second gain stage 1226, is controlled via the output from the control logic 1232. The output of programmable amplifier 1234 provides the compensated $V_{SENSE}$ signal. The code provided by the control logic 1232 is updated during the phase in which the operational amplifier 1212 is reset responsive to a reset signal applied to switch 1216 the reset signal is applied while the sensed current $i_p$ is zero.

Figure 13:
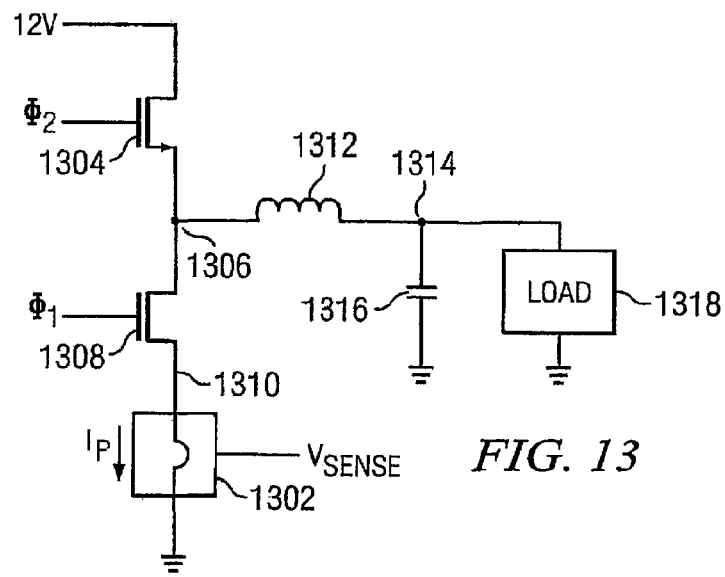
FIG. 13 is a schematic diagram illustrating the integrated current sensor within a switched power supply circuit.

The current sensor is designed to be used in, for example, a switched power supply. When the current $i_p$ is equal to zero, a reset signal may be applied to switch 1216 to reset the capacitor 1214, and the logic value applied to amplifier 1234 via control logic 1232 is updated responsive to the presently sensed temperature from temperature sensor 1228. Referring now to FIG. 13, there is provided one example of how to apply the reset signal to a current sensor 1302 within a buck converter circuit. In this case, the buck converter circuit control signal $\phi_1$ is applied to a transistor 1304 having its drain/source path connected between 12 volts and node 1306. A second transistor 1308 has its drain/source path connected between node 1306 and node 1310. Transistor 1308 is controlled by a second control signal $\phi_2$. The current sensor 1302 is connected between node 1310 and ground to detect current $i_p$ and provide a control signal $V_{SENSE}$. An inductor 1312 is connected between node 1306 and node 1314. A capacitor 1316 is connected between node 1314 and ground. A load 1318 is also connected between node 1314 and ground. In one embodiment, the reset signal to switch 1216 of the current sensor 1302 may be configured to be the control signal $\phi_2$.

Figure 14:
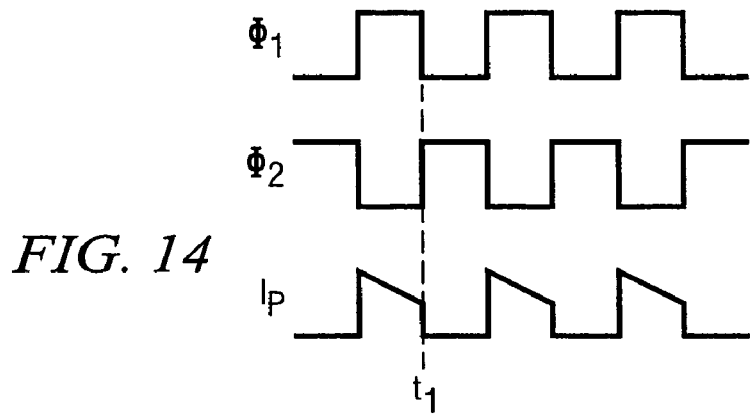
FIG. 14 is a timing diagram illustrating operation of the switched power supply circuit of FIG. 13.

As illustrated in FIG. 14, the current $i_p$ is zero when signal $\phi_1$ goes low and when signal $\phi_2$ goes high at, for example, time $t_1$. Integrator 1218 is reset during phase two when signal $\phi_2$ goes high and the current sensor would accept signal $\phi_2$ as an input to drive the reset signal to switch 1216, since the current $i_p$ is zero during this time. As can be seen each time the signal $\phi 2$ goes high, the current $i_p$ is zero enabling the reset signal to be applied to the integrator circuit 1218.

Figure 15:
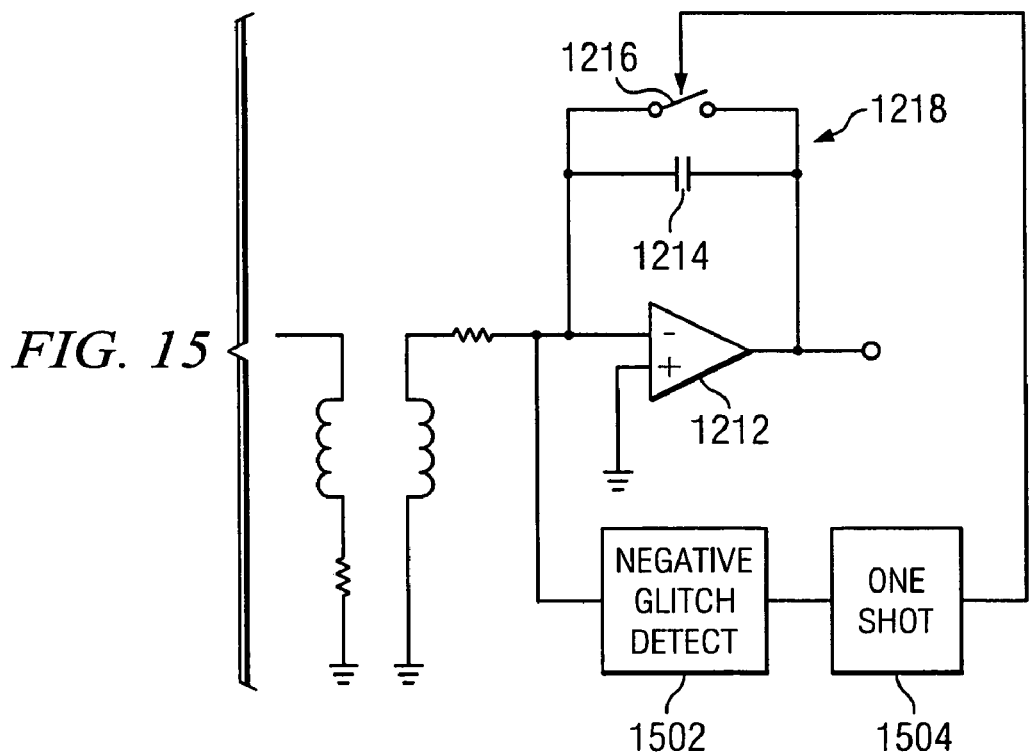
FIG. 15 illustrates a further method for controlling the reset switch of the integrated current sensor.

Referring now to FIG. 15, there is illustrated an alternative embodiment wherein the reset signal to the reset switch 1216 is generated responsive to a one shot circuit consisting of negative glitch detect circuit 1502 and one shot circuit 1504. When the current $i_p$ goes low as illustrated, for example, at $t_1$ in FIG. 14, the negative glitch detect circuit 1502 will detect the negative edge of current $i_p$. In response to this detection, the negative glitch detect circuit 1502 generates a pulse to the one shot circuit 1504. The one shot circuit 1504 then generates the reset signal to the reset switch 1216 responsive to the pulse from the negative glitch detect circuit 1502. Other methods for detecting when the sensed current $i_p$ goes to zero may also be utilized for generating the reset signal to reset switch 1216. The examples illustrated in FIGS. 13-15 are merely provided as examples of some embodiments thereof.

Although the preferred embodiment has been described in detail, it should be understood that various changes, substitutions and alterations can be made therein without departing from the scope of the invention as defined by the appended claims.

What is claimed is:

1. A current sensor, comprising:
   an integrated circuit die including a coil in a metal layer of the integrated circuit die;
   an integrated circuit die package to hold the integrated circuit die; and
   a conductor located within the integrated circuit die package and outside of the integrated circuit die, and coupled to receive a current from one or more input terminals of the integrated circuit die package and supply the current to one or more output terminals of the integrated circuit die package, the conductor located such that the coil and the conductor are inductively coupled; and wherein at least a first region of the conductor is parallel to a horizontal surface of the integrated circuit die and the first region of the conductor is longer than a width of the coil and at least a portion of the first region of the conductor overlaps a portion of the coil.

2. The current sensor of claim 1, wherein the coil is located in a top metal layer of the integrated circuit die.

3. The current sensor of claim 1, wherein the conductor is located on top of the integrated circuit die.

4. The current sensor of claim 1, wherein the conductor comprises copper.

5. The current sensor of claim 1, wherein the conductor is offset from a center of the coil, and at least one half of the coil is non-overlapped by the conductor.

6. The apparatus as recited in claim 1 further comprising a first and second plurality of bond wires coupled to the conductor, the first plurality of bond wires coupled to supply the conductor with the current and the second plurality of bond wires coupled to receive the current from the conductor.

7. The current sensor of claim 1, further including a lead frame for supporting the integrated circuit die in an inverted position above the conductor.

8. The current sensor of claim 7, wherein the lead frame is connected to the inverted integrated circuit die by solder balls.

9. A current sensor, comprising:
a first area of an integrated circuit die containing functional circuitry, the functional circuitry contained in a substrate of the integrated circuit die;
a second area of the integrated circuit die containing an inductor for detecting a current, wherein the inductor comprises a coil in a metal layer of the integrated circuit die;
a conductor located in an integrated circuit package housing the integrated circuit die;
wherein the conductor is coupled to receive a current from one or more input terminals of the integrated circuit die package and to supply the current to one or more output terminals of the integrated circuit die package, the conductor located such that the inductor and the conductor are inductively coupled; and
wherein at least a first region of the conductor is parallel to a horizontal surface of the integrated circuit die and the first region of the conductor is longer than a width of the inductor and at least a portion of the first region of the conductor overlaps a portion of the inductor.

10. The current sensor of claim 9, wherein the coil is located in the top metal layer of the integrated circuit.

11. The current sensor of claim 9 wherein the conductor is formed of copper.

12. A current sensor, comprising:
a first area of an integrated circuit containing functional circuitry, the functional circuitry contained in a substrate of the integrated circuit;
a second area of the integrated circuit containing an inductor for detecting a current, wherein the inductor comprises a coil in a metal layer of the integrated circuit; and
a conductor located in an integrated circuit package housing the integrated circuit, the conductor placed close enough to the coil such that the coil and the conductor are inductively coupled with each other, wherein the conductor overlaps only a first portion of the coil to enable an induced current within the coil responsive to a current in the conductor; and
further including a lead frame for supporting the integrated circuit in an inverted position above the conductor.

13. The current sensor of claim 12, wherein the lead frame is connected to the inverted integrated circuit by solder balls.

14. A method for forming a current sensor comprising:
forming a conductor in an integrated circuit package for housing an integrated circuit die having an inductor, the conductor for carrying current to be sensed, wherein the conductor is disposed with respect to the inductor so as to be inductively coupled to enable a current in the conductor to be measured in the integrated circuit die, the conductor being formed so as to receive a current from one or more input terminals of the integrated circuit die package and to supply the current to one or more output terminals of the integrated circuit die package, and wherein at least a first region of the conductor is formed parallel to a horizontal surface of the integrated circuit die and the first region of the conductor is longer than a width of the inductor and at least a portion of the first region of the conductor is formed so as to overlap a portion of the inductor.

15. The method as recited in claim 14 wherein the conductor is formed of copper.

16. The method as recited in claim 14 wherein the conductor is formed so as to be capable of carrying up to about 10 amps of current.

17. A current sensor, comprising:
an integrated circuit die including a metal coil in a layer of the integrated circuit die;
an integrated circuit die package to hold the integrated circuit die; and
a conductor located within the integrated circuit die package and outside of the integrated circuit die, and coupled to receive a current from one or more input terminals of the integrated circuit die package and supply the current to one or more output terminals of the integrated circuit die package, the conductor and the metal coil being inductively coupled; and
wherein at least a first region of the conductor is parallel to a horizontal surface of the integrated circuit die and the first region of the conductor is longer than a width of the metal coil and at least a portion of the first region of the conductor overlaps a portion of the metal coil.

* * * * *

UNITED STATES PATENT AND TRADEMARK OFFICE
CERTIFICATE OF CORRECTION

PATENT NO. : 7,679,162 B2
APPLICATION NO. : 11/311517
DATED : March 16, 2010
INVENTOR(S) : Timothy J. Dupuis et al.

It is certified that error appears in the above-identified patent and that said Letters Patent is hereby corrected as shown below:

Title Page, Fig. 12, Sheet 5 of 7, please replace the top occurrence of label "1224" with --1223--

Signed and Sealed this

First Day of June, 2010

David J. Kappos
*Director of the United States Patent and Trademark Office*